United States Patent [19]
Sato

[11] Patent Number: 5,304,830
[45] Date of Patent: Apr. 19, 1994

[54] SEMICONDUCTOR INTEGRATED CIRCUIT DEVICE FOR BI-CMOS CONFIGURATION FREE FROM NOISES ON POWER VOLTAGE LINES

[75] Inventor: Masaharu Sato, Tokyo, Japan

[73] Assignee: NEC Corporation, Tokyo, Japan

[21] Appl. No.: 22,133

[22] Filed: Feb. 25, 1993

[30] Foreign Application Priority Data

Feb. 27, 1992 [JP] Japan ................... 4-041477

[51] Int. Cl.[5] .................. H01L 29/76; H01L 29/94; H01L 29/00
[52] U.S. Cl. ................... 257/338; 257/371; 257/372; 257/550
[58] Field of Search ............. 257/338, 371, 373, 386, 257/404, 370, 544, 545, 547, 549, 550, 372, 373

[56] References Cited

U.S. PATENT DOCUMENTS 5,122,855  6/1992  Shirai ................... 257/550
5,198,880  3/1993  Taguchi et al. ........... 257/371

FOREIGN PATENT DOCUMENTS 9222957  2/1983  Japan .................. 257/372

Primary Examiner—William L. Sikes
Assistant Examiner—Fetsum Abraham
Attorney, Agent, or Firm—Sughrue, Mion, Zinn, Macpeak & Seas

[57] ABSTRACT

A semiconductor integrated circuit device is fabricated from a complementary inverter circuit and an emitter coupled logic circuit, and an n-type well assigned to a p-channel type transistor extends beneath a p-type well assigned to an n-channel type transistor for partially overlapping therewith, thereby increasing capacitance across the p-n junction for eliminating noises from power voltages.

6 Claims, 5 Drawing Sheets

SEMICONDUCTOR INTEGRATED CIRCUIT DEVICE FOR BI-CMOS CONFIGURATION FREE FROM NOISES ON POWER VOLTAGE LINES

FIELD OF THE INVENTION

This invention relates to a semiconductor integrated circuit device and, more particularly, to a semiconductor integrated circuit device for Bi-CMOS configuration.

DESCRIPTION OF THE RELATED ART

A typical example of the complementary inverter is illustrated in FIG. 1 of the drawings, and is fabricated on a p-type semiconductor substrate 1. A p-type well 2 and an n-type well 3 are formed in surface portions of the p-type semiconductor substrate 1, and are adjacent to each other. A thick field oxide film 4 is selectively grown on the major surface of the p-type semiconductor substrate 1, and defines active areas in the p-type and n-type wells 2 and 3. The p-type substrate 1 and the p-type well 2 are biased through a heavily doped p-type region 2a with the lowest voltage, and the n-type well 3 is biased through a heavily doped n-type region 3a with the highest voltage so that the n-type well 3 is electrically isolated from the p-type substrate 1 by means of a p-n junction 3b reversely biased. The p-n junction 3b thus reversely biased forms a capacitor C1 coupled with the high and low power supply lines, and the capacitor C1 is operative to eliminate noises on the highest and lowest voltage lines due to switching actions of component transistors. The p-type well 2 is as deep as the n-type well 3, and the p-type well 2 and the n-type well 3 form a p-n junction 2b beneath the thick field oxide film 4. The p-n junction 2b also form a capacitor C2, and the capacitor behaves as similar to the capacitor C1. The p-n junction 2b vertically extend from the thick field oxide film 4. However, the p-type and or n-type well never extend between the p-type semiconductor substrate 1 and the bottom surface of the other well. In this prior art example, the p-type well 2 and the n-type well are 140 square-micron and 150 square-micron, respectively, and the p-n junction 2b extends over 2 microns. Therefore, the capacitor C2 is much smaller in capacitance than the capacitor C1.

The p-type well 2 is assigned to an n-channel type field effect transistor 5, and the n-channel type field effect transistor 5 comprises heavily doped n-type source/drain regions 5a and 5b respectively accompanied with lightly doped n-type sub-regions 5c and 5d, a thin gate oxide film 5e and a gate electrode 5f accompanied with side walls 5g.

The n-type well 3 is assigned to a p-type field effect transistor 6, and the p-type field effect transistor 6 similarly comprises heavily doped p-type source/drain regions 6a and 6b accompanied with lightly doped p-type sub-regions 6c and 6d, a thin gate oxide film 6e and a gate electrode 6f accompanied with wide walls 6g. Both of the n-type field effect transistor 5 and the p-type field effect transistor 6 are covered with an inter-level insulating film 7, and wiring strips (not shown) extend and selectively held in contact with the source and drain regions 5a, 5b, 6a and 6b for achieving a complementary switching action.

However, the complementary inverter circuit allows current to flow therethrough only when an input signal switches the complementary inverter circuit over. For this reason, the switching action is causative to noises on the power voltage lines. The noises are much smaller than the amplitude of the output node of the complementary inverter circuit, and the complementary inverter circuit is less susceptible to the noises on the power voltage lines. However, if an emitter coupled logic circuit is fabricated on the same semiconductor substrate 1 in the vicinity of the complementary inverter circuit, the component bipolar transistors of the emitter coupled logic circuit are liable to be affected by the noises, because the emitter coupled logic circuit is smaller in amplitude than the complementary inverter circuit. Moreover, a field effect transistor tends to be shortened in channel length, and hardly withstand against voltage fluctuation between the source and drain regions thereof rather than the previous generation.

In order to prevent the emitter coupled logic circuit and the short channel type field effect transistor from malfunction due to the noises on the power voltage lines, an additional capacitor coupled with the power voltage lines takes up the noises. However, such an additional capacitor either increases the production cost or enlarges the p-type semiconductor substrate 1.

SUMMARY OF THE INVENTION

It is therefore an important object of the present invention to provide a semiconductor integrated circuit device which is free from the problems inherent in the prior art.

To accomplish the object, the present invention proposes to overlap a well of one conductivity type with another well of the other conductivity type.

In accordance with one aspect of the present invention, there is provided a complementary inverter circuit fabricated on a semiconductor substrate of a first conductivity type, comprising: a) a first field effect transistor of one channel conductivity type having source and drain regions of a second conductivity type formed in a first well of the first conductivity type defined in a surface portion of the semiconductor substrate, and a first gate structure on a surface of the first well, the first conductivity type being opposite to the second conductivity type, the first well being biased with a first power voltage; b) a second field effect transistor of the opposite channel conductivity type having source and drain regions of the first conductivity type formed in a second well of the second conductivity type defined in another surface portion of the semiconductor substrate, and a second gate structure on a source of the second well, the second well being deeper than the first well so as to extend beneath the first well, thereby overlapping therewith, the second well being biased with a second power voltage different from the first power voltage; and c) a wiring network selectively interconnecting the source and drain regions of the first field effect transistor, the source and drain regions of the second field effect transistor, a source of the first power voltage and a source of the second power voltage for achieving a complementary switching action of the complementary inverter circuit.

In accordance with another aspect of the present invention, there is provided an integrated circuit device fabricated on a semiconductor substrate of a first conductivity type, comprising: a) a complementary inverter circuit having a-1) a first field effect transistor of one channel conductivity type having source and drain regions of a second conductivity type formed in a first well of the first conductivity type defined in a surface portion of the semiconductor substrate, and a first gate structure on a surface of the first well, the first conductivity type being opposite to the second conductivity type, the first well being biased with a first power voltage, a-2) a second field effect transistor of the opposite channel conductivity type having source and drain regions of the first conductivity type formed in a second well of the second conductivity type defined in another surface portion of the semiconductor substrate, and a second gate structure on a source of the second well, the second well being deeper than the first well so as to extend beneath the first well, thereby overlapping therewith, the second well being biased with a second power voltage different from the first power voltage, and a-3) a wiring network selectively interconnecting the source and drain regions of the first field effect transistor, the source and drain regions of the second field effect transistor, a source of the first power voltage and a source of the second power voltage for achieving a complementary switching action of the complementary inverter circuit; and b) a bipolar transistor forming a part of a component circuit which in turn forms a part of the integrated circuit, and formed in yet another surface portion of the semiconductor substrate.

BRIEF DESCRIPTION OF THE DRAWINGS

The features and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 1:
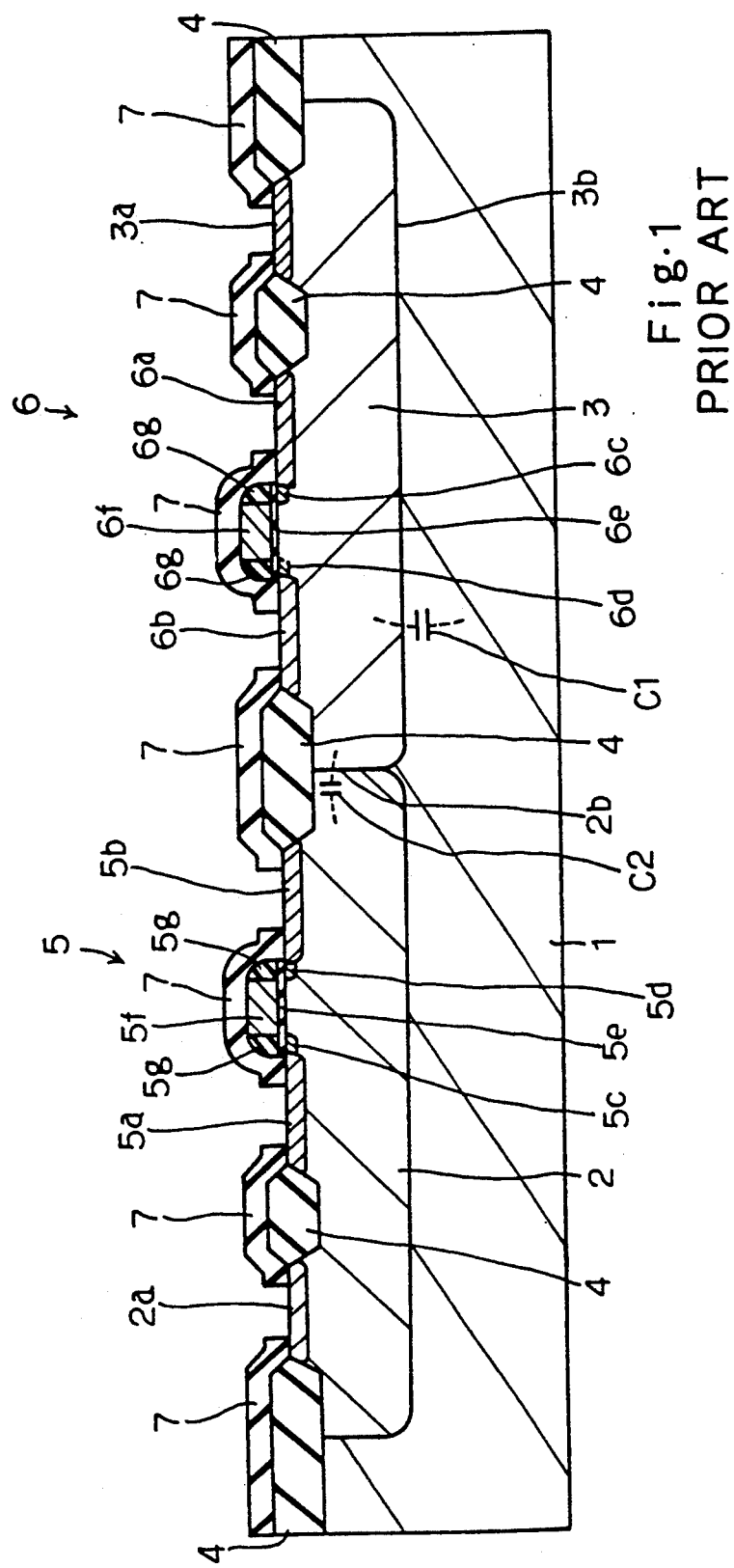
FIG. 1 is a cross sectional view showing the structure of the prior art complementary inverter circuit.
Figure 2:
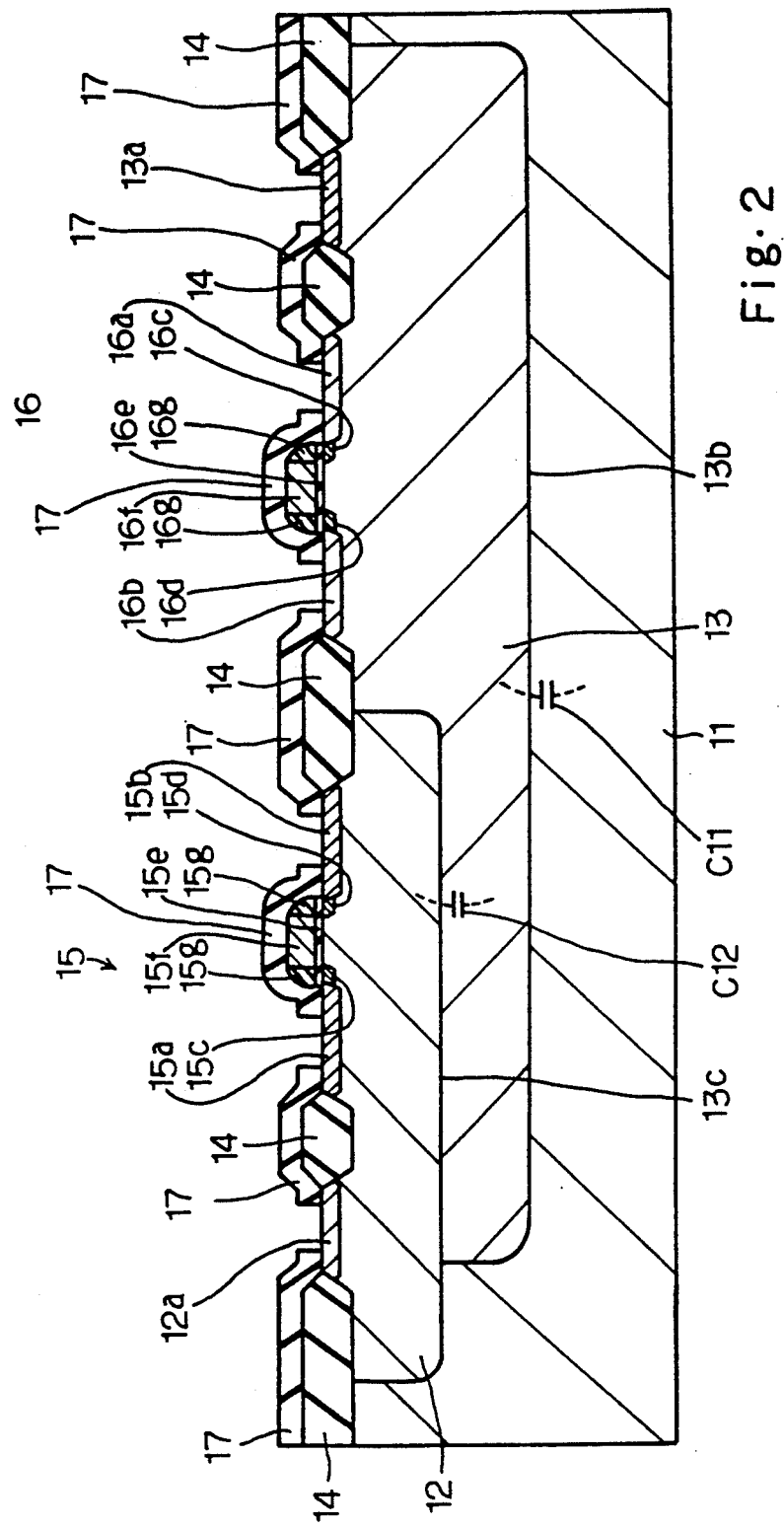
FIG. 2 is a cross sectional view showing the structure of a complementary inverter circuit according to the present invention.

Referring to FIG. 2 of the drawings, a complementary inverter circuit embodying the present invention is fabricated on a p-type silicon substrate 11, and forms an integrated circuit together with other component circuits (not shown). A p-type well 12 and an n-type well 13 are formed in surface portions of the p-type silicon substrate 11, and a thick field oxide film 14 is selectively grown on the major surface of the p-type silicon substrate 11, and defines active areas in the p-type and n-type wells 12 and 13. As will be described hereinlater, the p-type silicon substrate 11 and the p-type well 12 are biased through a heavily doped p-type region 12a with the lowest or the ground voltage level, and the n-type well 13 is biased through a heavily doped n-type region 13a with the highest or a positive power voltage level so that the n-type well 13 is electrically isolated from the p-type silicon substrate 11 and the p-type well 12 by means of a p-n junction 13b and a p-n junction 13c both reversely biased, respectively. The p-n junctions 13b and 13c thus reversely biased form a capacitor C11 together with the p-type silicon substrate 11 and a capacitor C12 together with the p-type well 12, and the capacitors C1 and C2 eliminate noises on the ground and positive power voltage lines.

The n-type well 13 is deeper than the p-type well 12, and the n-type well 13 extends beneath the p-type well 12 so as to be partially overlapped therewith. In this instance, the p-type well 12 is as shallow as the p-type well 2, and the n-type well is as deep as 3 microns. The n-type well 13 covers 80% of the bottom surface of the p-type well 12. Even if the total amount of the area occupied by the p-type and n-type wells 12 and 13 is equal to that of the prior art, the n-type well 13 thus partially extending beneath the p-type well 12 not only makes the p-n junction 13b larger in area than the p-n junction 3b but also allows the p-n junction 13c to be larger in area than the p-n junction 2b. For this reason, the total capacitance of the capacitors C11 and C12 is much larger than the total capacitance of the capacitors C1 and C2 without any increase of the occupation area.

The p-type well 12 is assigned to an n-channel type field effect transistor 15, and the n-channel type field effect transistor 15 comprises heavily doped n-type source/drain regions 15a and 15b respectively accompanied with lightly doped n-type sub-regions 15c and 15d, a thin gate oxide film 15e and a gate electrode 15f accompanied with side walls 15g.

Figure 3:
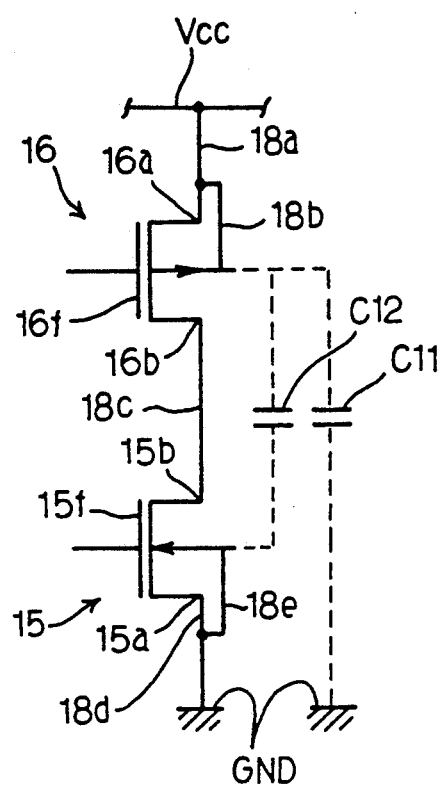
FIG. 3 is a circuit diagram showing the complementary inverter circuit.

The n-type well 13 is assigned to a p-type field effect transistor 16, and the p-type field effect transistor 16 similarly comprises heavily doped p-type source/drain regions 16a and 16b accompanied with lightly doped p-type sub-regions 16c and 16d, a thin gate oxide film 16e and a gate electrode 16f accompanied with wide walls 16g. Both of the n-type field effect transistor 15 and the p-type field effect transistor 16 are covered with an inter-level insulating film 17. Wiring strips 18a to 18e are formed on the inter-level insulating film 17, and selectively held in contact with the source and drain regions 15a, 15b, 16a and 16b as shown in FIG. 3 for achieving a complementary switching action. Namely, the wiring strips 18a and 18d are coupled between the source regions 16a and 15a and the positive power voltage line Vcc and the ground voltage line GND, respectively, and the wiring strips 18b and 18e are respectively branched from the positive power voltage line Vcc and the ground voltage line GND for coupling with the heavily doped n-type region 13a and the heavily doped p-type region 12a. The wiring strip 18c interconnects the drain regions 15b and 16b, and the voltage level on the wiring strip 18c is taken out as an output signal of the complementary inverter circuit.

As will be appreciated from the foregoing description, the extension of the n-type well effectively increases the total capacitance coupled between the power voltage line Vcc and the ground voltage line GND without any increase of the occupation area, and noises are taken up by the capacitors C11 and C12. This results in stable switching actions of the component transistors of the integrated circuit fabricated on the p-type silicon substrate 11.

Second Embodiment

Figure 4:
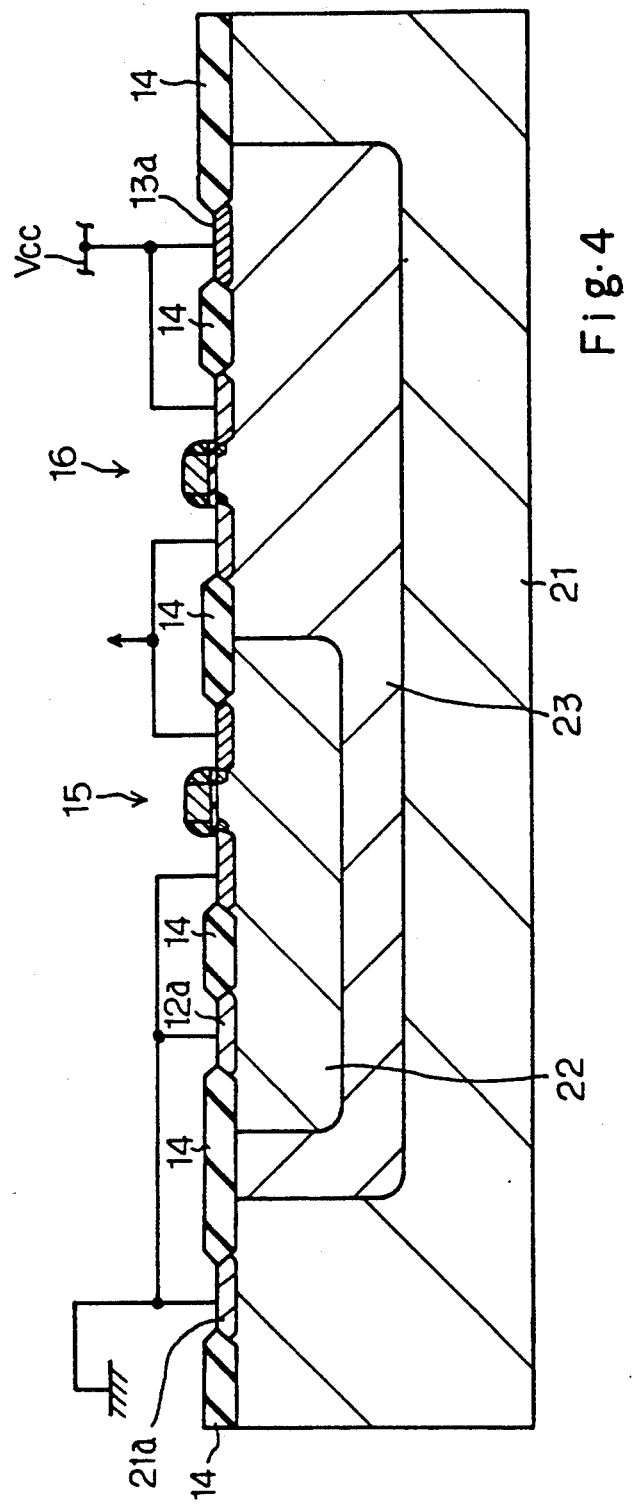
FIG. 4 is a cross sectional view showing the structure of another complementary inverter circuit according to the present invention.

Turning to FIG. 4 of the drawings, another complementary inverter circuit embodying the present invention is fabricated on a p-type silicon substrate 21, and a p-type well 22 is formed in an n-type well 23 so that the entire surface of the p-type well 22 is held in contact with the n-type well 23. The p-type well 22 is electrically isolated from the p-type silicon substrate 21 by means of the n-type well 23, and the p-type silicon substrate 21 is directly biased through a heavily doped p-type region 21a. However, the other features are similar to the first embodiment, and the other components are labeled with the same references as those designating the corresponding components of the first embodiment without any detailed description for the sake of simplicity.

The complementary inverter circuit thus arranged not only increases the p-n junction between the p-type well 22 and the n-type well 23 rather than the first embodiment but also have various additional advantages. First, the impurity profile of the p-type well 22 is simpler than that of the p-type well 12. This is because of the fact that the p-type well 12 is held in contact with the p-type silicon substrate 11 and with the n-type well 13, and the impurity profile of the p-type well 12 is complex over the p-n junction between the p-type silicon substrate 11 and the n-type well 13. Another additional advantage is that the p-type well 22 can be biased independently from the p-type silicon substrate 21. Although FIG. 4 illustrates the p-type silicon substrate 21 and the p-type well 22 both biased with the ground voltage level, the p-type well 22 can biased with any appropriate bias voltage, and changes the transistor characteristics of the n-channel type field effect transistor 15.

Third Embodiment

Figure 5:
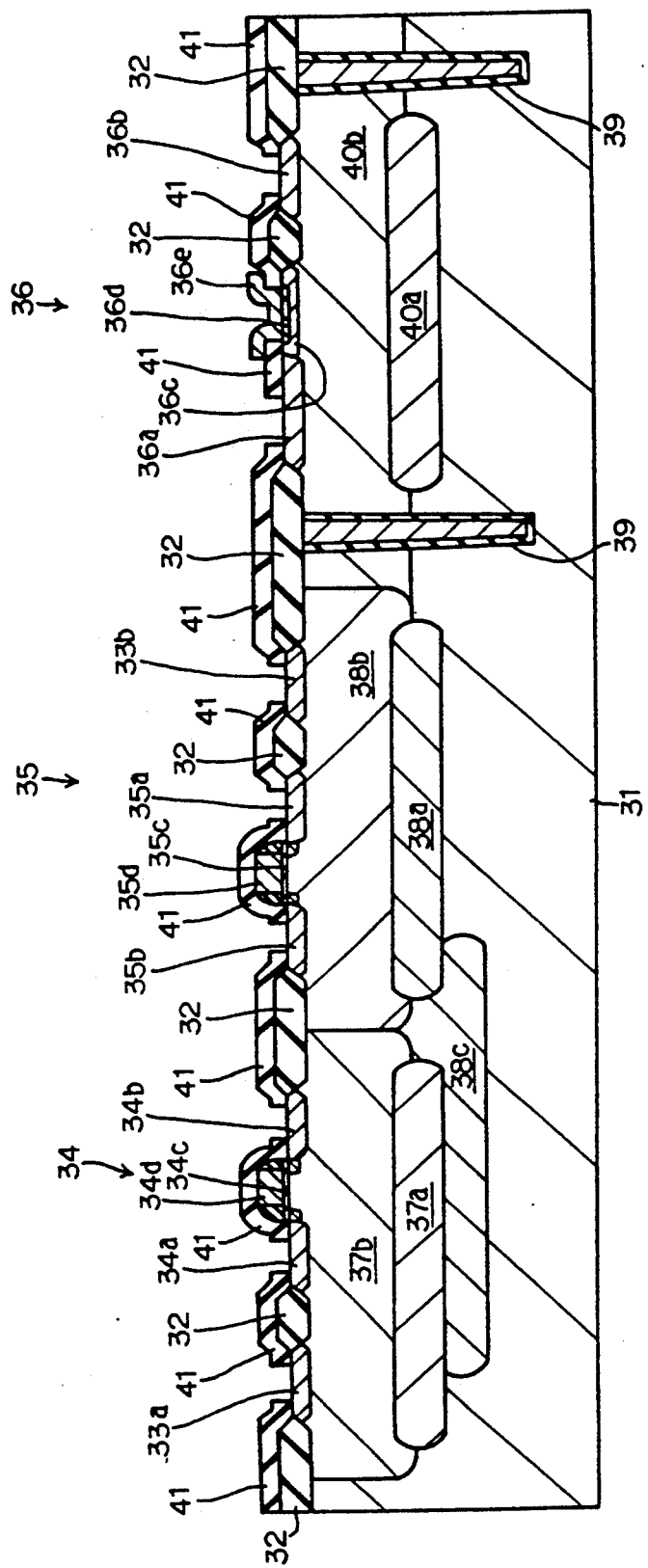
FIG. 5 is a cross sectional view showing the structure of a semiconductor integrated circuit device according to the present invention.

Turning to FIG. 5 of the drawings, an integrated circuit device embodying the present invention is fabricated on a p-type silicon substrate 31, and a field oxide film 32 is selectively grown on the major surface of the p-type silicon substrate 31 so that a plurality of surface areas are defined by the field oxide film 32. FIG. 5 shows six surface areas respectively assigned to a heavily doped p-type contact region 33a, an n-channel type field effect transistor 34, a p-channel type field effect transistor 35, a heavily doped n-type contact region 33b, a heavily doped p-type base contact region/ an n-p-n type bipolar transistor 36 and a heavily doped n-type collector contact region 36b.

A heavily doped p-type buried layer 37a is formed under the surface areas assigned to the heavily doped p-type contact region 33a and the n-channel type field effect transistor 34, and the heavily doped p-type buried layer 37a is overlain by a p-type well 37b. The p-type well 37b is wider than the heavily doped p-type buried layer 37a, and the peripheral portion of the p-type well 37b is outside the heavily doped p-type buried layer 37a. The heavily doped p-type contact region 33a is in the p-type well 37b, and is coupled with the lowest or the ground voltage level.

The n-channel type field effect transistor 34 comprises heavily doped n-type source and drain regions 34a and 34b accompanied with lightly doped subregions, a thin gate oxide film 34c, and a gate electrode 34d, and the thin gate oxide film 34c and the gate electrode 34d as a whole constitute a gate structure. The heavily doped n-type source and drain regions 34a and 34b are in the p-type well 37b, and the combination of the heavily doped p-type buried layer 37a and the p-type well 37b corresponds to the p-type well 12 of the first embodiment.

A heavily doped n-type buried layer 38a is formed under the surface areas assigned to the p-channel type field effect transistor 35 and the heavily doped n-type contact region 33b, and is spaced from the heavily doped p-type buried layer 37a. The heavily doped n-type buried layer 38a is overlain by an n-type well 38b, and the heavily doped n-type contact region 33b is formed in the n-type well 38b. The heavily doped n-type contract region 33b is coupled with a positive power voltage line (not shown). The n-type well 38b is wider than the heavily doped n-type buried layer 38a, and the peripheral portion of the n-type well 38b is outside the heavily doped n-type buried layer 38a. The n-type well 38b forms a p-n junction with the p-type well 37b, and a lightly doped n-type buried layer 38c extends from the n-type well 38b through the gap between the heavily doped n-type buried layer 38a and the heavily doped p-type buried layer 37a along the bottom surface of the heavily doped p-type buried layer 37a. The lightly doped n-type buried layer 38c is held in contact with the bottom surface of the heavily doped p-type buried layer 37a, and the combination of the heavily doped n-type buried layer 38a, the n-type well 38b and the lightly doped n-type buried layer 38c corresponds to the n-type well 13 of the first embodiment. For this reason, the n-type well 38b is partially overlapped with the p-type well 37b by means of the lightly doped n-type buried layer 38c and the heavily doped p-type buried layer 37a, and effectively increases the total capacitance of capacitors coupled between the positive power voltage line and the ground voltage line.

The p-channel type field effect transistor comprises p-type source and drain regions 35a and 35b, a thin gate oxide film 35c and a gate electrode 35d on the thin gate oxide film 35c, and the thin gate oxide film 35c and the gate electrode 35d also form in combination a gate structure.

Though not shown in FIG. 5, the n-channel type field effect transistor 34 and the p-channel type field effect transistor 35 are coupled so as to form a complementary inverter circuit, and the wiring arrangement is identical with that shown in FIG. 3.

A trench isolation 39 is provided beneath the field oxide film 32 between the surface area assigned to the heavily doped n-type contact region 33b and the surface area assigned to the base contact region 36a, and establishes electrical isolation between the complementary inverter circuit and the n-p-n type bipolar transistor 36.

A heavily doped n-type buried collector layer 40a is formed under the surface areas assigned to the base contact region 36a/ the n-p-n type bipolar transistor 36 and the collector contact region 36b, and is overlain by an n-type epitaxial layer 40b. The heavily doped n-type buried collector layer 40a is either coupled with or isolated from the lightly doped n-type buried layer 38c depending upon the purpose of the buried collector layer 40a. Namely, if an output signal of the n-p-n type bipolar transistor 36 is taken out from the buried collector layer 40a, the buried collector layer 40a is electrically isolated from the lightly doped n-type buried layer 38c, because the lightly doped n-type buried layer 38c increases the capacitive load.

In the n-type epitaxial layer 40b is formed a lightly doped p-type base region which is contiguous to the base contact region 36a. A heavily doped n-type emitter layer 36c is nested within the lightly doped base region 36d, and is coupled with an emitter electrode 36e. The n-p-n type bipolar transistor 36 thus arranged forms a part of a component circuit which in turn forms a part of the integrated circuit. The component circuit may be an emitter coupled logic circuit.

Finally, an inter-level insulating film 41 covers the n-channel type field effect transistor 34, the p-channel type field effect transistor 35 and the n-p-n type bipolar transistor 36, and the wiring arrangement for the complementary inverter circuit and wirings of the emitter coupled logic circuit extends over the inter-level insulating film 41 for selectively coupling the regions with each other.

As will be understood from the foregoing description, the integrated circuit implementing the third embodiment effectively increases the total capacitance of the capacitors coupled between the positive power voltage line and the ground voltage line. Since the heavily doped buried layers 37a and 36a form parts of the capacitors, the depletion layers are narrower than those of the first embodiment, and the capacitors incorporated in the third embodiment are larger in capacitance than those of the first embodiment in so far as the occupation area is equivalent.

If a capacitor of 1 pF is effective against the noises, the capacitor independently formed in a surface area of a silicon substrate consumes 1000 square-microns. However, the capacitors according to the present invention is fabricated under the circuit components, and consumption of the real estate is substantially zero. Therefore, the structure according to the present invention is desirable for an integrated circuit device.

Although particular embodiments of the present invention have been shown and described, it will be obvious to those skilled in the art that various changes and modifications may be made without departing from the spirit and scope of the present invention. For example, only complementary inverter circuits may be formed in a silicon substrate and accompanied with heavily doped buried layers for increasing the total capacitance.

What is claimed is:

1. A complementary inverter circuit fabricated on a semiconductor substrate of a first conductivity type, comprising:
   a) a first field effect transistor of one channel conductivity type having source and drain regions of a second conductivity type formed in a first well of said first conductivity type defined in a surface portion of said semiconductor substrate, and a first gate structure on a surface of said first well, said first conductivity type being opposite to said second conductivity type, said first well being biased with a first power voltage;
   b) a second field effect transistor of the opposite channel conductivity type having source and drain regions of said first conductivity type formed in a second well of said second conductivity type defined in another surface portion of said semiconductor substrate, and a second gate structure on a source of said second well, said second well being deeper than said first well and partially overlapping said first well to allow a portion of said first well to remain in contact with said semiconductor substrate, said second well being biased with a second power voltage different from said first power voltage; and
   c) a wiring network selectively interconnecting said source and drain regions of said first field effect transistor, said source and drain regions of said second field effect transistor, a source of said first power voltage and a source of said second power voltage for achieving a complementary switching action of said complementary inverter circuit.

2. A complementary inverter circuit as claimed in claim 1, wherein said first well comprises a lightly doped first impurity region and a heavily doped first buried layer projecting from a central area of the bottom surface of said lightly doped first impurity region, and said second well comprises a lightly doped second impurity region forming a p-n junction together with said lightly doped first impurity region, a heavily doped second buried layer projecting from a central area of the bottom surface of said lightly doped second impurity region and spaced apart from said heavily doped first buried layer, and a lightly doped buried layer extending from said lightly doped second impurity region through a gap between said heavily doped first buried layer and said heavily doped second buried layer along a bottom surface of said heavily doped first buried layer so that the heavily doped first buried layer and said lightly doped buried layer are partially overlapped with one another.

3. An integrated circuit device fabricated on a semiconductor substrate of a first conductivity type, comprising:
   a) a complementary inverter circuit having:
      a-1) a first field effect transistor of one channel conductivity type having source and drain regions of a second conductivity type formed in a first well of said first conductivity type defined in a first surface portion of a said semiconductor substrate, and a first gate structure on a surface of said first well, said first conductivity type being opposite to said second conductivity type, said first well being biased with a first power voltage;
      a-2) a second field effect transistor of a second channel conductivity type, opposite to said one channel conductivity type, having source and drain regions of said first conductivity type formed in a first second well of said second conductivity type defined in a second surface portion of said semiconductor substrate, and a second gate structure on a source of said second well, said second well being deeper than said first well and partially overlapping said first well to allow a portion of said first well to remain in contact with said semiconductor substrate, said second well being biased with a second power voltage different from said first power voltage; and
      a-3) a wiring network selectively interconnecting said source and drain regions of said first field effect transistor, and source and drain regions of said second field effect transistor, a source of said first power voltage and a source of said second power voltage for achieving a complementary switching action of said complementary inverter circuit; and
   b) a bipolar transistor, forming part of a component circuit of said integrated circuit, and being formed in a third surface portion of said semiconductor substrate.

4. An integrated circuit device as claimed in claim 3, wherein said first well comprises a lightly doped first impurity region and a heavily doped first buried layer projecting from a central area of the bottom surface of said lightly doped first impurity region, and said second well comprises a lightly doped second impurity region forming a p-n junction together with said lightly doped first impurity region, a heavily doped second buried layer projecting from a central area of the bottom surface of said lightly doped second impurity region and spaced apart from said heavily doped first buried layer, and a lightly doped buried layer extending from said lightly doped second impurity region through a gap between said heavily doped first buried layer and said heavily doped second buried layer along a bottom surface of said heavily doped first buried layer so that the heavily doped first buried layer and said lightly doped buried layer are partially overlapped with one another.

5. A complementary inverter circuit as claimed in claim 1, wherein said first well has an impurity concentration larger than an impurity concentration of said semiconductor substrate.

6. An integrated circuit device as claimed in claim 3, wherein said first well has an impurity concentration larger than an impurity concentration of said semiconductor substrate.

* * * * *